(12) United States Patent
Kaneda

(10) Patent No.: US 9,536,859 B2
(45) Date of Patent: *Jan. 3, 2017

(54) SEMICONDUCTOR DEVICE PACKAGING HAVING PLURALITY OF WIRES BONDING TO A LEADFRAME

(71) Applicant: ROHM CO., LTD., Kyoto-shi, Kyoto (JP)

(72) Inventor: Hiroyuki Kaneda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/721,589

(22) Filed: May 26, 2015

(65) Prior Publication Data

US 2015/0255425 A1 Sep. 10, 2015

Related U.S. Application Data

(63) Continuation of application No. 13/909,278, filed on Jun. 4, 2013, now Pat. No. 9,070,682.

(30) Foreign Application Priority Data

Jun. 4, 2012 (JP) ................................. 2012-126816

(51) Int. Cl.
*H01L 23/48* (2006.01)
*H01L 29/66* (2006.01)
(Continued)

(52) U.S. Cl.
CPC ............. *H01L 24/85* (2013.01); *H01L 23/293* (2013.01); *H01L 23/4952* (2013.01);
(Continued)

(58) Field of Classification Search
CPC ........ H01L 24/85; H01L 24/06; H01L 23/293; H01L 23/4952; H01L 23/49551; H01L 23/49562; H01L 23/49575; H01L 23/52; H01L 24/46; H01L 24/48; H01L 24/49; H01L 23/4956; H01L 23/49951; H01L 24/73; H01L 24/78; H01L 2224/4848
(Continued)

(56) References Cited

U.S. PATENT DOCUMENTS 5,521,432 A 5/1996 Tsuji et al.
6,294,830 B1 9/2001 Fjelstad
(Continued)

FOREIGN PATENT DOCUMENTS

JP 2012-64880 3/2012

*Primary Examiner* — Dzung Tran
(74) *Attorney, Agent, or Firm* — Hamre, Schumann, Mueller & Larson, P.C.

(57) ABSTRACT

A semiconductor device includes a semiconductor element, a lead, and a wire including a first bonding portion bonded to the semiconductor element and a second bonding portion bonded to the lead. The semiconductor element includes a first bonding surface which faces to a first side in a first direction and to which the first bonding portion is bonded. The lead includes a second bonding surface and a third bonding surface both facing to the first side in the first direction and forming an angle larger than 180° on the first side in the first direction. The semiconductor device further includes a ball bump extending onto both the second bonding surface and the third bonding surface. The second bonding portion is bonded to the lead via the ball bump.

20 Claims, 13 Drawing Sheets

(51) Int. Cl.
*H01L 21/70* (2006.01)
*H01L 23/00* (2006.01)
*H01L 23/52* (2006.01)
*H01L 23/495* (2006.01)
*H01L 23/29* (2006.01)

(52) U.S. Cl.
CPC .. *H01L 23/49551* (2013.01); *H01L 23/49562* (2013.01); *H01L 23/49575* (2013.01); *H01L 23/52* (2013.01); *H01L 24/06* (2013.01); *H01L 24/46* (2013.01); *H01L 24/48* (2013.01); *H01L 24/49* (2013.01); *H01L 24/45* (2013.01); *H01L 24/73* (2013.01); *H01L 24/78* (2013.01); *H01L 2224/04042* (2013.01); *H01L 2224/0603* (2013.01); *H01L 2224/32245* (2013.01); *H01L 2224/45015* (2013.01); *H01L 2224/45144* (2013.01); *H01L 2224/45147* (2013.01); *H01L 2224/4848* (2013.01); *H01L 2224/48091* (2013.01); *H01L 2224/48247* (2013.01); *H01L 2224/48465* (2013.01); *H01L 2224/4912* (2013.01); *H01L 2224/49111* (2013.01); *H01L 2224/49113* (2013.01); *H01L 2224/49431* (2013.01); *H01L 2224/49505* (2013.01); *H01L 2224/73265* (2013.01); *H01L 2224/78301* (2013.01); *H01L 2224/85051* (2013.01); *H01L 2224/85181* (2013.01); *H01L 2224/85186* (2013.01); *H01L 2224/85205* (2013.01); *H01L 2224/85385* (2013.01); *H01L 2224/85986* (2013.01); *H01L 2224/92247* (2013.01); *H01L 2924/00014* (2013.01); *H01L 2924/01029* (2013.01); *H01L 2924/01079* (2013.01); *H01L 2924/01322* (2013.01); *H01L 2924/181* (2013.01)

(58) Field of Classification Search
USPC . 257/741, 773, 330, 776, 737, 506; 438/111
See application file for complete search history.

(56) References Cited

U.S. PATENT DOCUMENTS

| | | | |
|---|---|---|---|
| 6,787,926 B2 * | 9/2004 | Chen | H01L 23/3128 174/258 |
| 2002/0105069 A1 * | 8/2002 | Kawahara | H01L 21/4832 257/690 |
| 2003/0080405 A1 | 5/2003 | Suzuki | |
| 2005/0133928 A1 * | 6/2005 | Howard | H01L 21/563 257/773 |
| 2006/0049523 A1 * | 3/2006 | Lin | H01L 23/49811 257/738 |
| 2006/0113665 A1 * | 6/2006 | Lee | H01L 23/13 257/734 |
| 2010/0133688 A1 | 6/2010 | Shigihara et al. | |
| 2010/0155915 A1 | 6/2010 | Bell et al. | |
| 2010/0203683 A1 | 8/2010 | Lee et al. | |
| 2012/0256314 A1 | 10/2012 | Har et al. | |

* cited by examiner

SEMICONDUCTOR DEVICE PACKAGING HAVING PLURALITY OF WIRES BONDING TO A LEADFRAME

This application is a Continuation of U.S. Continuation of U.S. Ser. No. 13/909,278, filed Jun. 4, 2013, which application is incorporated herein by reference.

BACKGROUND OF THE INVENTION

1. Field of the Invention

The present invention relates to a semiconductor device.

2. Description of the Related Art

FIG. 13 shows an example of conventional semiconductor device disclosed in Patent Document 1 (see e.g. JP-A-2012-64880). The semiconductor device 900 shown in the figure includes a semiconductor element 91, leads 92, 93, wires 94 and a resin package 95. The semiconductor element 91 is mounted on the lead 92. The semiconductor element 91A has a plurality of non-illustrated electrodes on the upper surface. These electrodes and the leads 93 are connected to each other by the wires 94. The semiconductor element 91 and the wires 94 are covered by the resin package 95. Each wire 94 is bonded first to the electrode of the semiconductor element 91 and bonded second to a lead 93. The semiconductor element 91, the leads 93 and the wires 94 provide a wire bonding structure.

To realize size reduction of the semiconductor device 900, the leads 93, which are structural parts of the semiconductor device, need to be made smaller. However, proper bonding of the wires 94 becomes more difficult as the leads 93 become smaller. Further, the wires 94 need to be bonded to the lead 93 with sufficient bonding strength.

SUMMARY OF THE INVENTION

The present invention has been conceived under the above-described circumstances. It is therefore an object of the present invention to provide a semiconductor device that is capable of realizing size reduction and enhancement of the wire bonding strength.

A semiconductor device provided according to the present invention comprises a semiconductor element, a lead, and a wire including a first bonding portion bonded to the semiconductor element and a second bonding portion bonded to the lead. The semiconductor element includes a first bonding surface which faces to a first side in a first direction and to which the first bonding portion is bonded. The lead includes a second bonding surface and a third bonding surface both facing to the first side in the first direction and forming an angle larger than 180° on the first side in the first direction. A ball bump extending onto both the second bonding surface and the third bonding surface is provided, and the second bonding portion is bonded to the lead via the ball bump.

In a preferred embodiment of the present invention, the second bonding surface is closer to the semiconductor element than the third bonding surface is.

In a preferred embodiment of the present invention, the third bonding surface is inclined to be deviated toward a second side in the first direction as proceeding away from the second bonding surface.

In a preferred embodiment of the present invention, the second bonding surface faces upright to the first side in the first direction.

In a preferred embodiment of the present invention, the second bonding surface and the third bonding surface adjoin to each other with a ridge inbetween.

In a preferred embodiment of the present invention, the second bonding surface and the third bonding surface have an elongated shape and are arranged next to each other in the width direction.

In a preferred embodiment of the present invention, the wire extends from the ball bump in the direction in which the second bonding surface and the third bonding surface are arranged next to each other.

In a preferred embodiment of the present invention, the second bonding portion overlaps the second bonding surface and the third bonding surface as viewed in the first direction.

In a preferred embodiment of the present invention, as viewed in the first direction, the area where the second bonding portion and the second bonding surface overlap each other is larger than the area where the second bonding portion and the third bonding surface overlap each other.

In a preferred embodiment of the present invention, the wire and the ball bump are made of Au.

In a preferred embodiment of the present invention, the lead has a bent shape comprising a front end including the second and the third bonding surfaces, a base end deviated toward a second side in the first direction from the front end, and a connecting portion connecting the front end and the base end to each other.

In a preferred embodiment of the present invention, the semiconductor device further comprises a die bonding portion on which the semiconductor element is mounted. The die bonding portion and the base end of the lead are at the same position in the first direction.

In a preferred embodiment of the present invention, the semiconductor element is provided with a gate electrode including the first bonding surface, and a main-current electrode, and conduction of the main-current electrode is controlled by input from the gate electrode. The semiconductor device further comprises a main-current lead insulated from the lead. The main-current electrode and the main-current lead are connected to each other by at least one main-current wire.

In a preferred embodiment of the present invention, the main-current wire comprises a plurality of main-current wires.

In a preferred embodiment of the present invention, the main-current wire is made of Cu.

In a preferred embodiment of the present invention, the main-current lead includes a main-current bonding surface to which the at least one main-current wire is bonded.

In a preferred embodiment of the present invention, the main-current bonding surface has an elongated shape. Each of the second and the third bonding surfaces has an elongated shape, and the longitudinal directions of the second and the third bonding surfaces correspond to the longitudinal direction of the main-current bonding surface.

In a preferred embodiment of the present invention, the main-current bonding surface and the second and the third bonding surfaces are parallel to an edge of the semiconductor device and overlap each other in a direction proceeding away from the edge.

In a preferred embodiment of the present invention, the semiconductor device further comprises a resin package covering the semiconductor element and the wire.

In a preferred embodiment of the present invention, the semiconductor device further comprises an additional semiconductor element including an additional first bonding surface, an additional lead including an additional second bonding surface and an additional third bonding surface, and an additional wire bonded to the additional first bonding surface, the additional second bonding surface and the additional third bonding surface. The second and the third bonding surfaces and the additional second and the additional third bonding surfaces are spaced apart from each other, with the semiconductor element and the additional semiconductor element positioned between them. The second and the third bonding surfaces and the additional second and the additional third bonding surfaces have elongated shapes. The longitudinal directions of the second and the third bonding surfaces and the longitudinal directions of the additional second and the additional third bonding surfaces are parallel to each other and perpendicular to the direction in which the second and the third bonding surfaces and the additional second and the additional third bonding surfaces are spaced apart from each other.

Other features and advantages of the present invention will become more apparent from detailed description given below with reference to the accompanying drawings.

DESCRIPTION OF THE PREFERRED EMBODIMENTS

Figure 1:
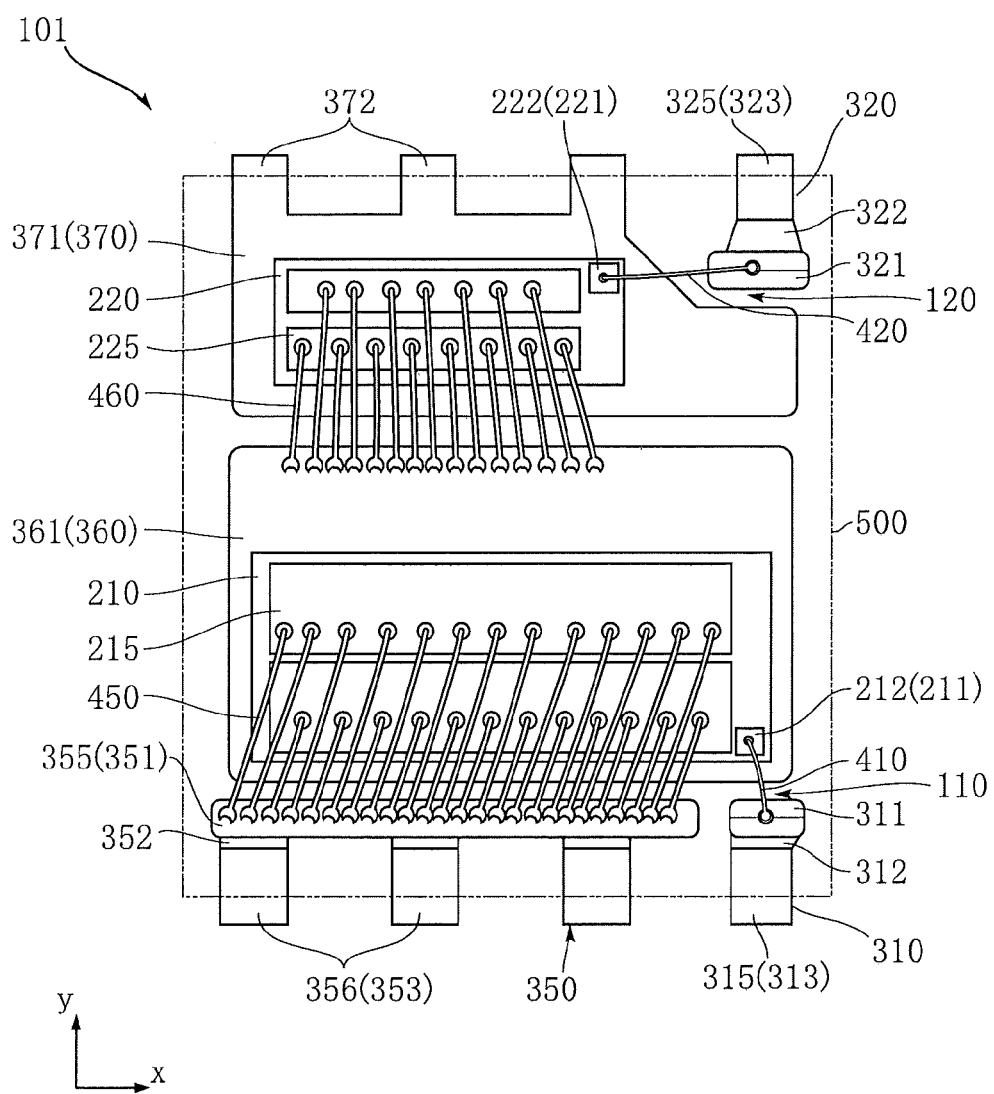
FIG. 1 is a schematic plan view showing an example of semiconductor device according to the present invention.

Preferred embodiments of the present invention are described below with reference to the accompanying drawings.

FIGS. 1-3 and FIGS. 5 and 6 show an example of semiconductor device according to the present invention. The semiconductor device 101 of this embodiment includes semiconductor elements 210, 220, leads 310, 320, 350, 360, 370, wires 410, 420, 450, 460 and a resin package 500. The semiconductor device 101 includes a wire bonding structure 110 made up of the semiconductor element 210, the lead 310 and the wire 410 and a wire bonding structure 120 made up of the semiconductor element 220, the lead 320 and the wire 420. For easier understanding, illustration of the resin package 500 is omitted in FIGS. 2, 3, 5 and 6.

For instance, the semiconductor element 210 may be structured as a transistor device. The semiconductor element 210 has a gate electrode 211 and a source electrode 215. The gate electrode 211 is an electrode through which a relatively small controlling current flows and arranged close to a corner of the semiconductor element 210. The upper surface of the gate electrode 211 serves as a bonding surface 212. The bonding surface 212 corresponds to the first bonding surface of the present invention. In this embodiment, the bonding surface 212 is square as viewed in the z direction. The gate electrode 211 is made of a metal such as Cu or Au. The source electrode 215 is an electrode through which a relatively large main current flows and made up of two parallel portions each in the form of an elongated rectangle. The source electrode 215 is made of a metal such as Cu or Au. The semiconductor element 210A has a non-illustrated drain electrode on the lower surface. Alternatively to this, the drain electrode may be on the upper surface of the semiconductor element 210 and the source electrode may be on the lower surface of the semiconductor element 210. The semiconductor element 210 may be e.g. about 150 µm in thickness.

The semiconductor element 220 may be structured as a transistor device and corresponds to the additional semiconductor element of the present invention. The semiconductor element 220 has a gate electrode 221 and a source electrode 225. The gate electrode 221 is an electrode through which a relatively small controlling current flows and arranged close to a corner of the semiconductor element 220. The upper surface of the gate electrode 221 serves as a bonding surface 222. The bonding surface 222 corresponds to the additional first bonding surface of the present invention. In this embodiment, the bonding surface 222 is square as viewed in the z direction. The gate electrode 221 is made of a metal such as Cu or Au. The source electrode 225 is an electrode through which a relatively large main current flows and made up of two parallel portions each in the form of an elongated rectangle. The source electrode 225 is made of a metal such as Cu or Au. The semiconductor element 220 has a non-illustrated drain electrode on the lower surface. Alternatively to this, the drain electrode may be on the upper surface of the semiconductor element 220 and the source electrode may be on the lower surface of the semiconductor element 220. The semiconductor element 220 may be e.g. about 150 µm in thickness.

The leads 310, 320, 350, 360, 370 support the semiconductor elements 210, 220 or provide a conduction path for electrical connection to the semiconductor elements 210, 220 and are plate-like members made of a metal such as Cu, Cu alloy or Fe—Ni alloy. When the lead 360 is made of Cu or Cu alloy, its surface may be plated with Ag. When the lead 360 is made of Fe—Ni alloy, its surface may be plated with Cu. The leads 310, 320, 350, 360, 370 are e.g. about 200 µm in thickness.

The lead 360 is rectangular as a whole, and its entirety serves as a die bonding portion 361. On the die bonding portion 361, the semiconductor element 210 is bonded via a conductive bonding material 218. The lead 360 corresponds to the main-current lead of the present invention.

The lead 370 is arranged adjacent to the lead 360 with an interval in the y direction. The lead 370 includes a die bonding portion 371 and a plurality of terminals 372. On the die bonding portion 371, the semiconductor element 220 is bonded via a conductive bonding material 228. Of a plurality of strip-like extensions extending from the die bonding portion 371 in the y direction, the portions exposed from the resin package 500 are the terminals 372. The lead 360 and the lead 370 are at the same position in the z direction.

The lead 310 is arranged adjacent to the lead 360. FIG. 3 is a schematic enlarged sectional view of the wire bonding structure 110 as seen from the right side in the x direction in FIG. 2. As shown in the figure, the lead 310 includes a front end 311, a connecting portion 312 and a base end 313 and is made by bending a metal plate. The base end 313 is at the same position as the leads 360 and 370 in the z direction. As shown in FIG. 1, part of the base end 313 is exposed from the resin package 500 to serve as a terminal 315. As shown in FIG. 3, the front end 311 is at a position shifted upward from the base end 313 in the z direction. The connecting portion 312 connects the front end 311 and the base end 313 to each other and is inclined with respect to the z direction. For instance, the shift amount between the base end 313 and the front end 311 in the z direction is about 150 µm.

Figure 2:
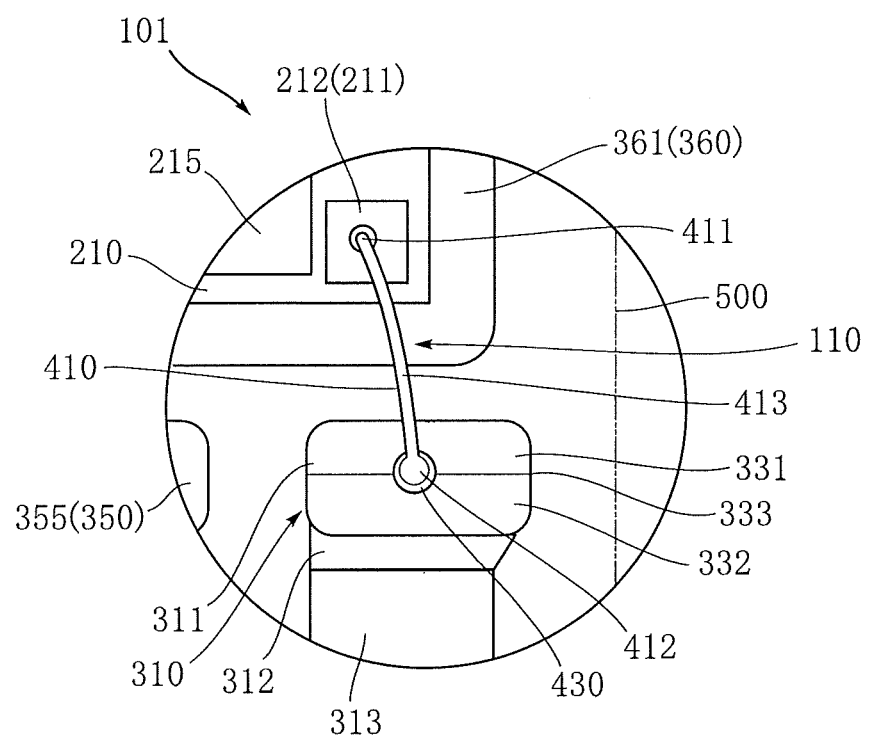
FIG. 2 is a schematic enlarged plan view showing the semiconductor device of FIG. 1.
Figure 3:
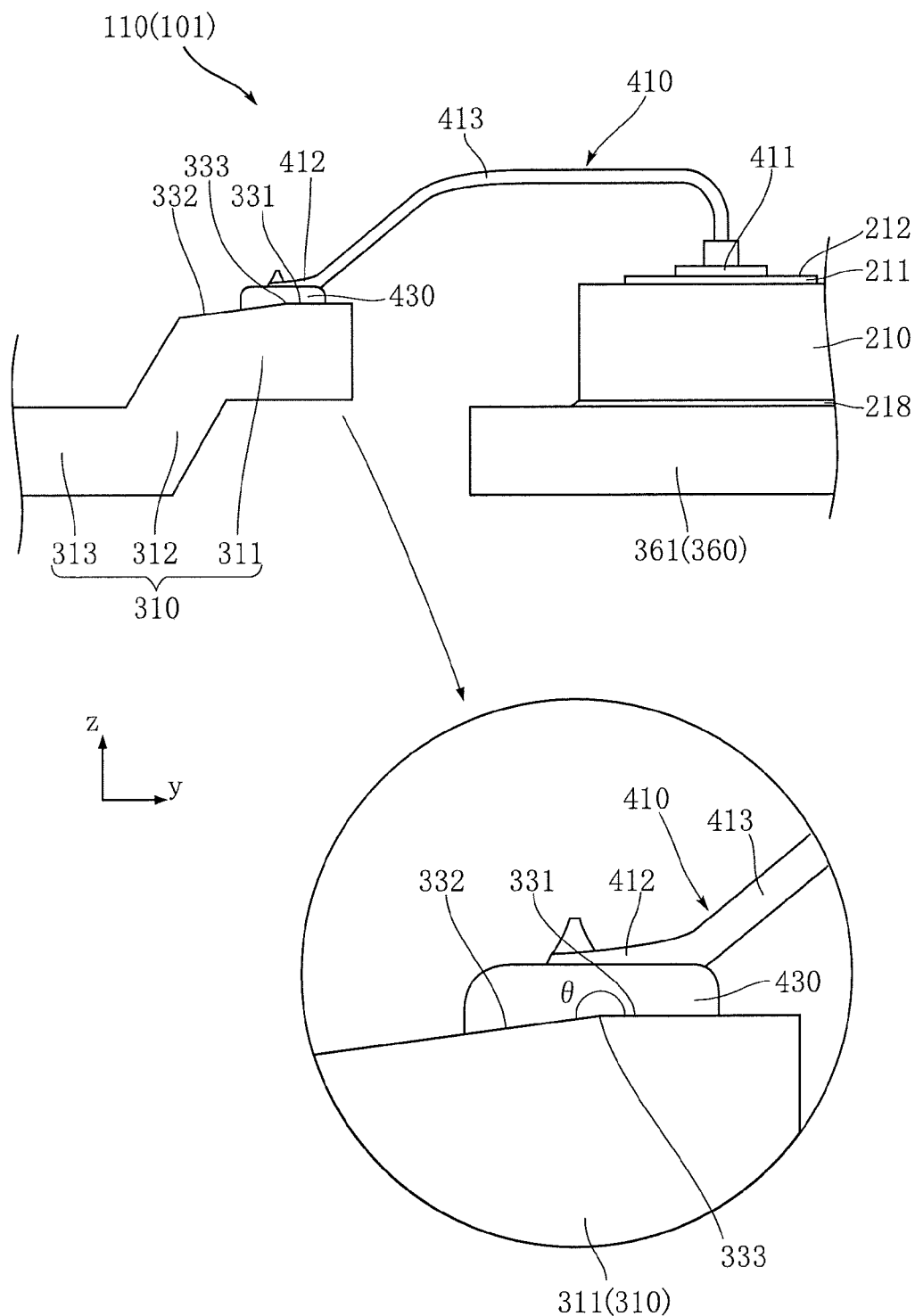
FIG. 3 is a schematic enlarged side view showing the semiconductor device of FIG. 1.

As shown in FIGS. 2 and 3, the upper surface of the front end 311 in the z direction serves as bonding surfaces 331 and 332. The bonding surfaces 331 and 332 are next to each other in the y direction and the bonding surface 331 is positioned closer to the lead 360. The bonding surface 331 corresponds to the second bonding surface of the present invention, whereas the bonding surface 332 corresponds to the third bonding surface of the present invention. Both of the bonding surfaces 331 and 332 face to upper sides in the z direction. This means that both of the bonding surfaces 331 and 332 can be seen from above in the z direction. The bonding surfaces 331 and 332 form an angle θ larger than 180° on the upper side in the z direction. In this embodiment, the angle θ is e.g. about 190°. In this embodiment, the bonding surface 331 faces upright in the z direction. This means that the direction normal to the bonding surface 331 corresponds to the z direction. The bonding surface 332 is inclined to be positioned on a lower side in the z direction as proceeding away from the bonding surface 331 in the y direction. The bonding surfaces 331 and 332 adjoin to each other with a ridge 333 inbetween. In this embodiment, both of the bonding surfaces 331 and 332 are elongated in the x direction. For instance, the dimension of the front end 311 in the x direction is about 0.6 mm and that in the y direction is about 0.26 mm.

Figure 5:
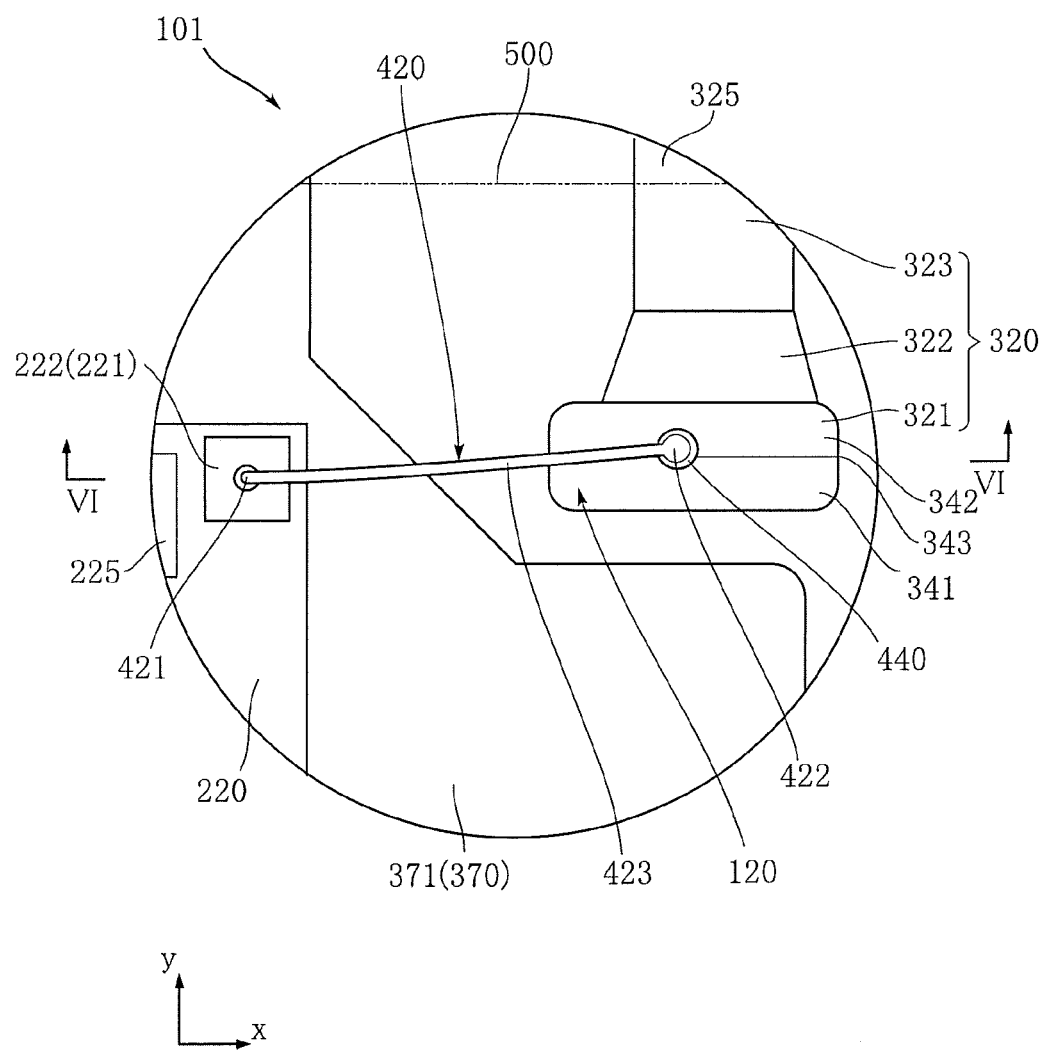
FIG. 5 is a schematic enlarged plan view showing the semiconductor device of FIG. 1.
Figure 6:
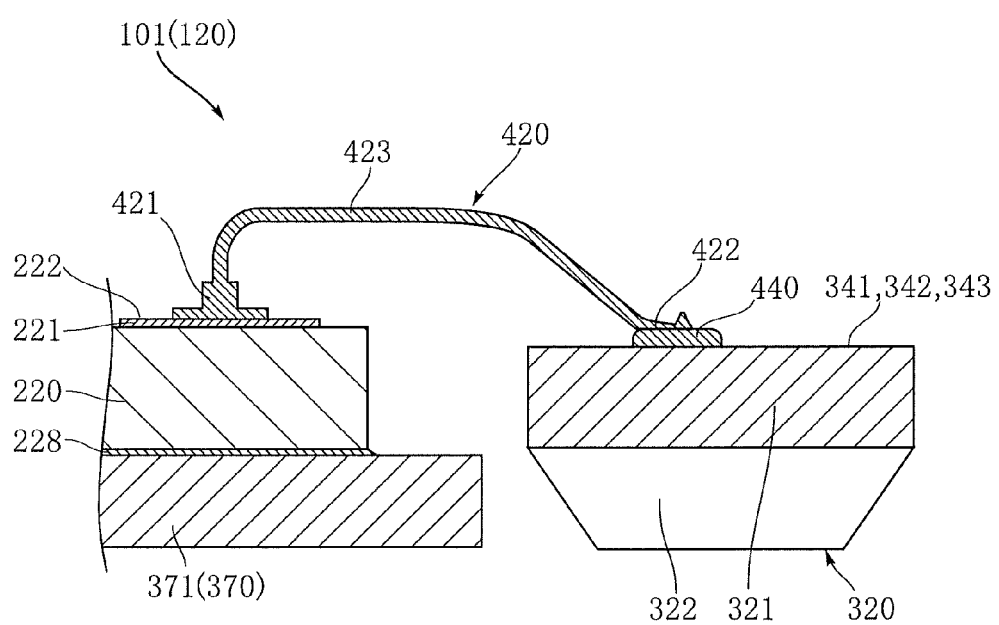
FIG. 6 is a schematic enlarged sectional view taken along lines VI-VI in FIG. 5.

The lead 320 is provided adjacent to the lead 370 and corresponds to the additional lead of the present invention. As shown in FIGS. 5 and 6, the lead 320 includes a front end 321, a connecting portion 322 and a base end 323 and is made by bending a metal plate. The base end 323 is at the same position as the leads 360 and 370 in the z direction. The part of the base end 323 which is exposed from the resin package 500 serves as a terminal 325. The front end 321 is at a position shifted upward from the base end 323 in the z direction. The connecting portion 322 connects the front end 321 and the base end 323 to each other and is inclined with respect to the z direction. For instance, the shift amount between the base end 323 and the front end 321 in the z direction is about 150 µm. The lead 310 and the lead 320 are spaced apart from each other in the y direction with the semiconductor elements 210 and 220 between them.

The upper surface of the front end 321 in the z direction serves as bonding surfaces 341 and 342. The bonding surfaces 341 and 342 are next to each other in the y direction, and the bonding surface 341 is positioned closer to the lead 370. The bonding surface 341 corresponds to the additional second bonding surface of the present invention, whereas the bonding surface 342 corresponds to the additional third bonding surface of the present invention. Both of the bonding surfaces 341 and 342 face to upper sides in the z direction. This means that both of the bonding surfaces 341 and 342 can be seen from above in the z direction. The bonding surfaces 341 and 342 form an angle θ larger than 180° on the upper side in the z direction. In this embodiment, the angle θ is e.g. about 190°. In this embodiment, the bonding surface 341 faces upright in the z direction. This means that the direction normal to the bonding surface 341 corresponds to the z direction. The bonding surface 342 is inclined to be positioned on a lower side in the z direction as proceeding away from the bonding surface 341 in the y direction. The bonding surfaces 341 and 342 adjoin to each other with a ridge 343 inbetween. In this embodiment, both of the bonding surfaces 341 and 342 are elongated in the x direction. For instance, the dimension of the front end 321 in the x direction is about 0.8 mm and that in the y direction is about 0.26 mm.

The lead 350 is arranged adjacent to the lead 360 in the y direction and aligned with the lead 310 in the x direction. The lead 350 corresponds to the main-current lead of the present invention. The lead 350 has a front end 351, a plurality of connecting portions 352, and a plurality of base ends 353. The base ends 353, each of which is in the form of a rectangular strip, are arranged in the x direction. The base ends 353 are at the same position as the leads 360, 370 in the z direction. The portions of the base ends 353 which are exposed from the resin package 500 serve as terminals 356. The front end 351 is at a position shifted upward from the base ends 353 in the z direction. The connecting portions 352 connect the front end 351 and the base ends 353 to each other and are inclined with respect to the z direction. For instance, the shift amount between the base ends 353 and the front end 351 in the z direction is about 150 µm. The upper surface of the front end 351 in the z direction serves as a bonding surface 355. The bonding surface 355 corresponds to the main-current bonding surface of the present invention. The bonding surface 355 is elongated in the x direction. The front end 311 of the lead 310 (the region made up of the bonding surfaces 331 and 332) and the front end 351 of the lead 350 (the bonding surface 355) are elongated in the same direction and arranged at the same position in the y direction.

The wire 410 connects the semiconductor element 210 and the lead 310 to each other. In this embodiment, the wire 410 is made of Au and has a wire diameter of about 33 µm. As shown in FIGS. 2 and 3, the wire 410 has a first bonding portion 411, a second bonding portion 412 and a bridge portion 413. The first bonding portion 411 is bonded to the bonding surface 212 of the gate electrode 211 of the semiconductor element 210. The second bonding portion 412 is bonded to the bonding surfaces 331, 332 of the lead 310 via a ball bump 430. The bridge portion 413 is a loop-like portion connecting the first bonding portion 411 and the second bonding portion 412 to each other. The bridge portion 413 extends perpendicularly (in the y direction) to the longitudinal direction (x direction) of the front end 311 (bonding surfaces 331, 332) of the lead 310.

The ball bump 430 is bonded to both of the bonding surfaces 331 and 332 across the ridge 333. In this embodiment, the ball bump 430 is made of Au and circular as viewed in the z direction. The ball bump 430 is to be bonded to both of the bonding surfaces 331 and 332, and it is preferable that the bonding area to the bonding surface 331 is larger than the bonding area to the bonding surface 332. As viewed in the z direction, the second bonding portion 412 overlaps the bonding surfaces 331, 332 and the ridge 333.

Figure 4:
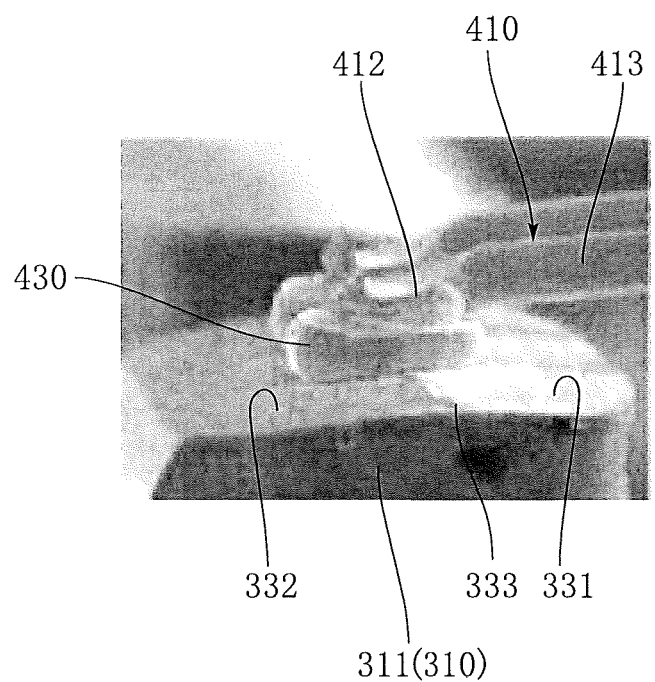
FIG. 4 is a photo image showing a wire bonding structure similar to that of the semiconductor device shown in FIG. 1.

The second bonding portion 412 is to overlap both of the bonding surfaces 331 and 332, and it is preferable that the area overlapping the bonding surface 331 is larger than the area overlapping the bonding surface 332. FIG. 4 is a photo image showing, as magnified, a region of the wire bonding structure 110 which includes the second bonding portion 412 of the wire 410.

The wire 420 connects the semiconductor element 220 and the lead 320 to each other and corresponds to the additional wire of the present invention. In this embodiment, the wire 420 is made of Au and has a wire diameter of about 33 μm. As shown in FIGS. 5 and 6, the wire 420 has a first bonding portion 421, a second bonding portion 422 and a bridge portion 423. The first bonding portion 421 is bonded to the bonding surface 222 of the gate electrode 221 of the semiconductor element 220. The second bonding portion 422 is bonded to the bonding surfaces 341, 342 of the lead 320 via a ball bump 440. The bridge portion 423 is a loop-like portion connecting the first bonding portion 421 and the second bonding portion 422 to each other. The bridge portion 423 extends in the longitudinal direction (x direction) of the front end 321 (bonding surfaces 341, 342) of the lead 320.

The ball bump 440 is bonded to both of the bonding surfaces 341 and 342 across the ridge 343. In this embodiment, the ball bump 440 is made of Au and circular as viewed in the z direction. As viewed in the z direction, the second bonding portion 422 overlaps the bonding surfaces 341, 342 and the ridge 343. The second bonding portion 422 is to overlap both of the bonding surfaces 341 and 342, and it is preferable that the area overlapping the bonding surface 341 is larger than the area overlapping the bonding surface 342.

The wires 450 are connected to the source electrode 215 of the semiconductor element 210 and the bonding surface 355 of the front end 351 of the lead 350 and correspond to the main-current wire of the present invention. In this embodiment, the wires 450 are made of Cu and have a wire diameter of about 50 μm.

The wires 460 are connected to the source electrode 225 of the semiconductor element 220 and the lead 360. In this embodiment, the wires 460 are made of Cu and have a wire diameter of about 50 μm.

The resin package 500 is made of e.g. black epoxy resin and protects the semiconductor elements 210, 220 and the wires 410, 420, 450, 460. The resin package 500 further covers the entirety of the lead 360 and part of each lead 310, 320, 350, 370.

An example of a method of making a semiconductor device 101 is described below with reference to FIGS. 7-12. Each of these figures is a schematic enlarged sectional view along a yz plane across the wire 410 in FIG. 2. Although the process steps for making the wire bonding structure 110 are mainly described with reference to these figures, the wire bonding structure 120 is also made by the similar process steps.

Figure 7:
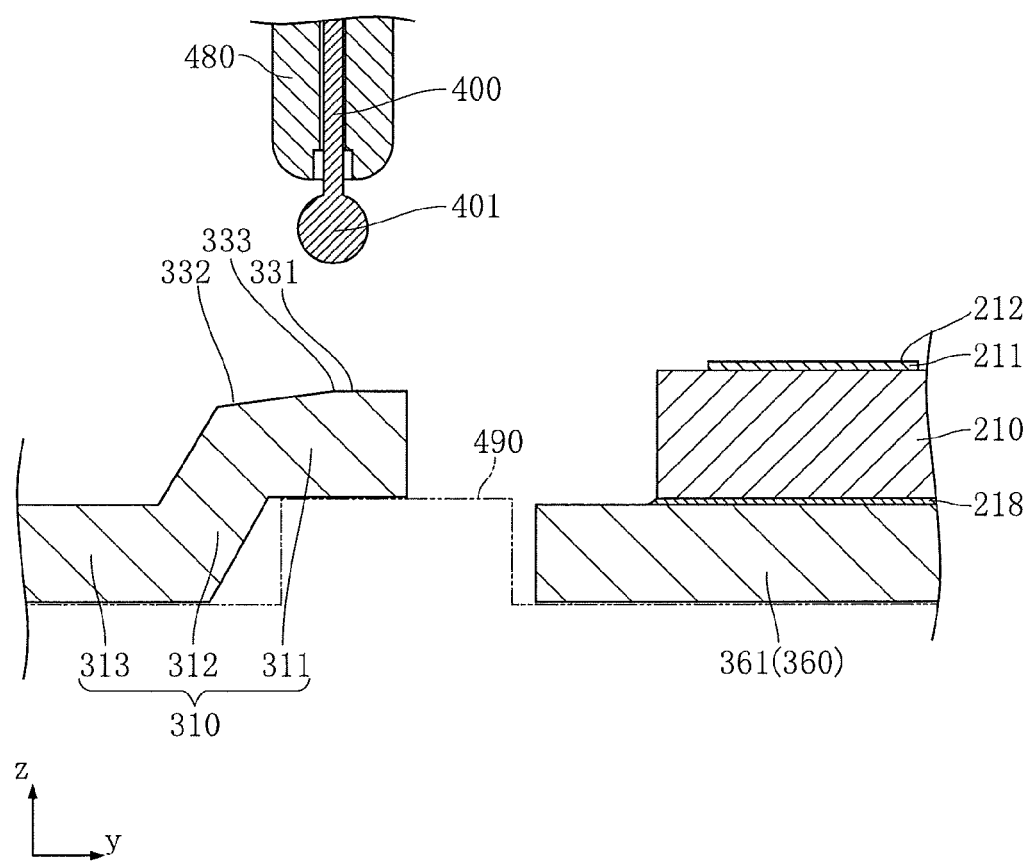
FIG. 7 is a schematic enlarged sectional view showing an example of a method for making the semiconductor device of FIG. 1.

First, as shown in FIG. 7, a lead 310 and a lead 360 are prepared and fixed to a jig 490. Similarly, leads 320, 350, 370 are also fixed. Then, a semiconductor element 210 is mounted on the die bonding portion 361 of the lead 360. A semiconductor element 220 is mounted on the die bonding portion 371 of the lead 370. Then, a capillary 480 with a wire 400 introduced in it is prepared. A ball 401 is formed at the end of the wire 400. The capillary 480 stands upright along the z direction and is movable in the x and the y directions and vertically along the z direction.

Figure 8:
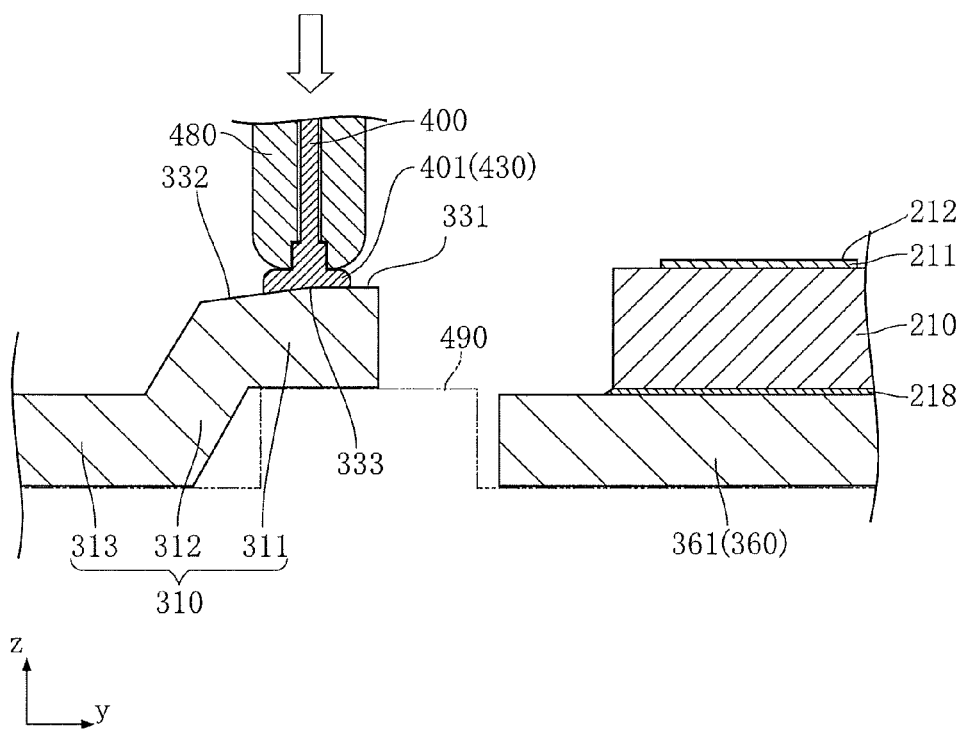
FIG. 8 is a schematic enlarged sectional view showing an example of a method for making the semiconductor device of FIG. 1.

Then, as shown in FIG. 8, the capillary 480 is moved down toward the lead 310. In this process, the capillary 480 is moved down, with the ball 401 overlapping the ridge 333 and the bonding surfaces 331, 332 as viewed in the z direction. Thus, the ball 401 is bonded to the bonding surfaces 331, 332. The ball 401 bonded in this way becomes the ball bump 430.

Figure 9:
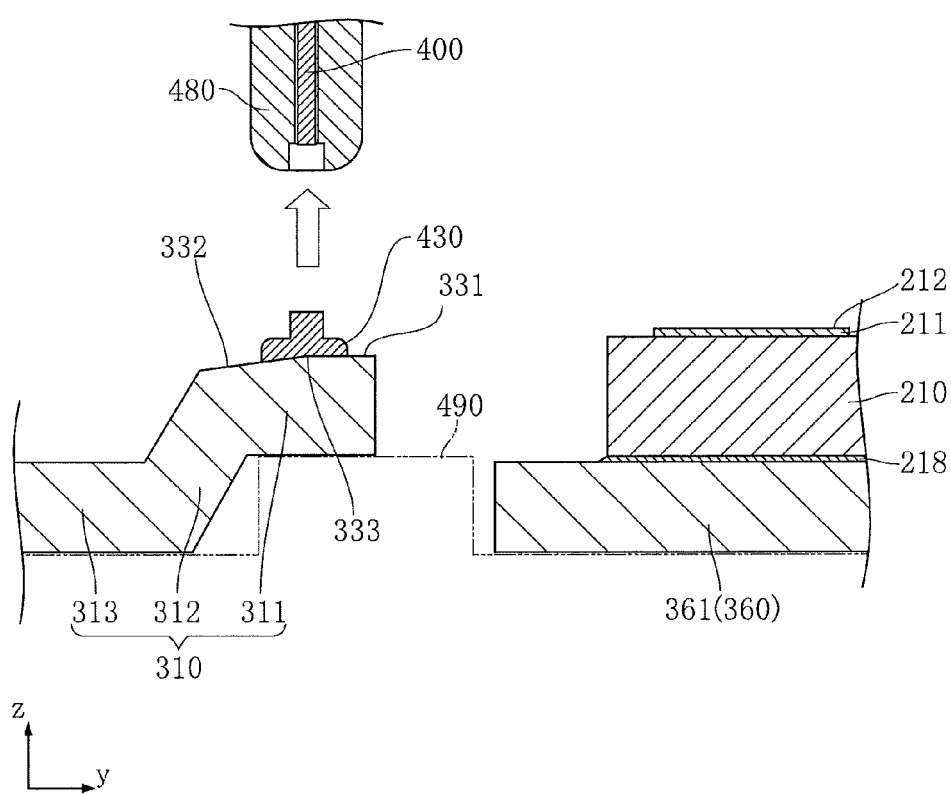
FIG. 9 is a schematic enlarged sectional view showing an example of a method for making the semiconductor device of FIG. 1.
Figure 10:
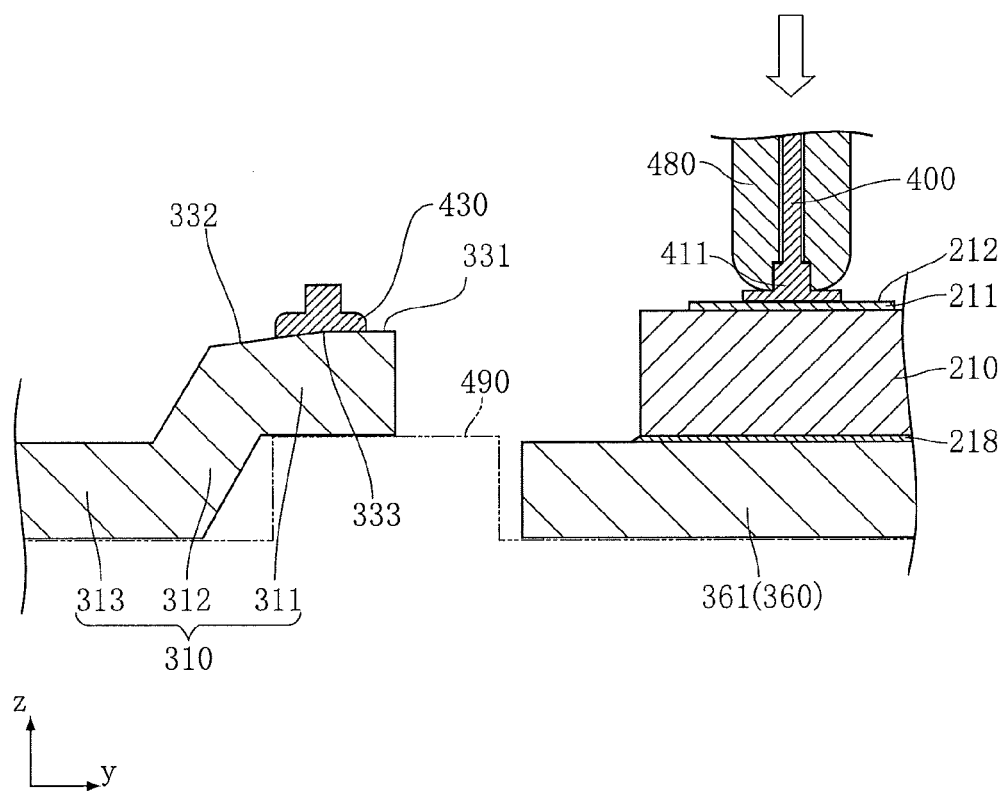
FIG. 10 is a schematic enlarged sectional view showing an example of a method for making the semiconductor device of FIG. 1.

Then, as shown in FIG. 9, the capillary 480 is moved up, with the feed of the wire 400 stopped. As a result, the ball bump 430 separates from the wire 400 and is left on the lead 310 side.

Then, after a ball 401 is formed again, the capillary 480 is moved down toward the semiconductor element 210. In this process, the capillary 480 is moved down, with the ball 401 overlapping the bonding surface 212 of the gate electrode 211 as viewed in the z direction. Thus, the ball 401 is pressed against the bonding surface 212, whereby the first bonding portion 411 is formed.

Figure 11:
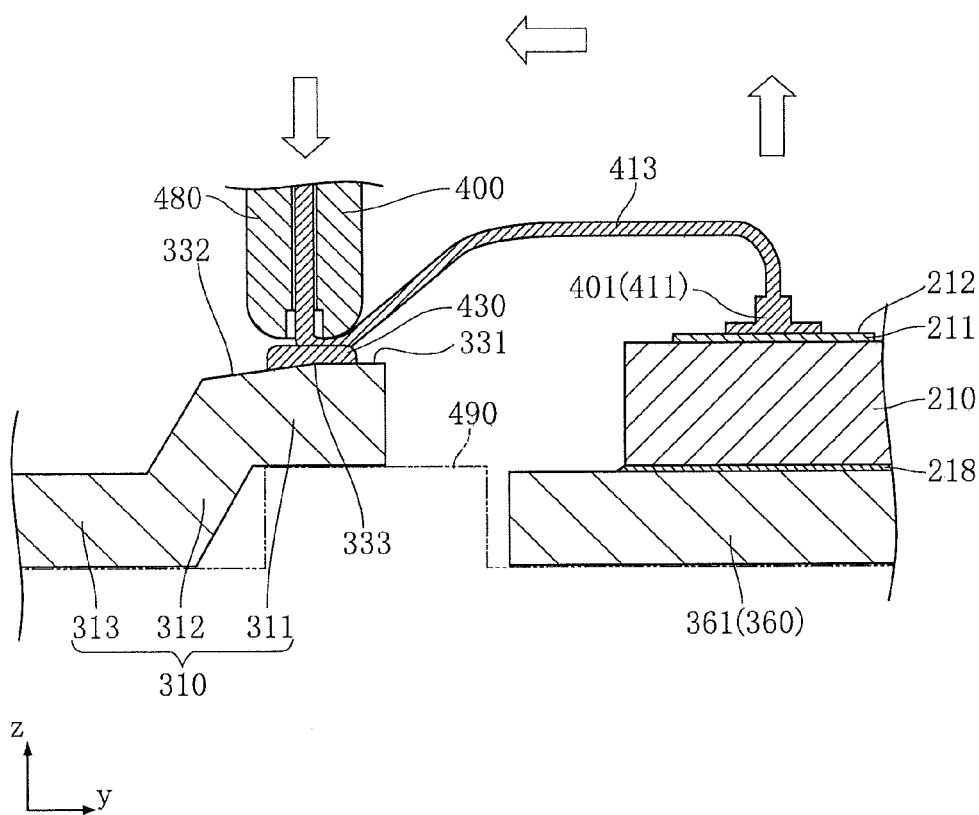
FIG. 11 is a schematic enlarged sectional view showing an example of a method for making the semiconductor device of FIG. 1.

Then, as shown in FIG. 11, the capillary 480 is moved from the gate electrode 211 of the semiconductor element 210 to the front end 311 of the lead 310 while feeding the wire 400. Then, part of the wire 400 is pressed against the ball bump 430 by the front end of the capillary 480. In this process, by applying ultrasonic vibration to the capillary 480, part of the wire 400 and the ball bump 430 are attached by eutectic bonding.

Figure 12:
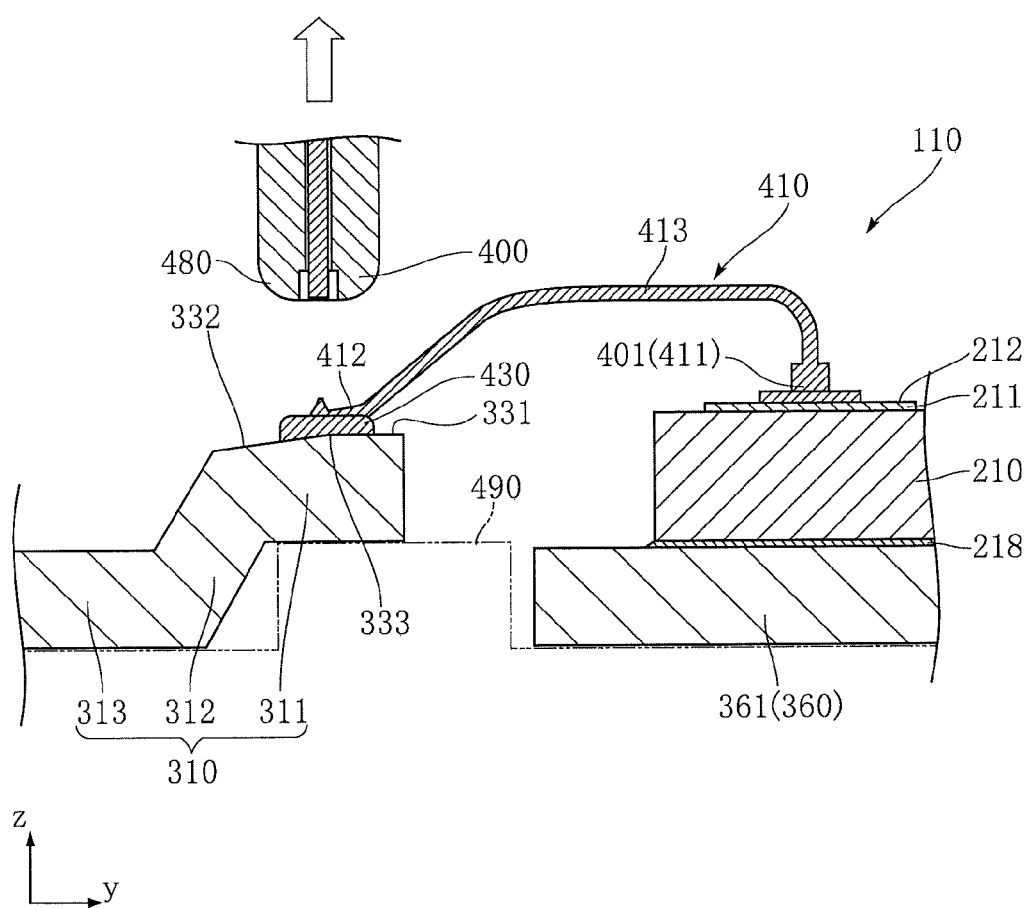
FIG. 12 is a schematic enlarged sectional view showing an example of a method for making the semiconductor device of FIG. 1.
Figure 13:
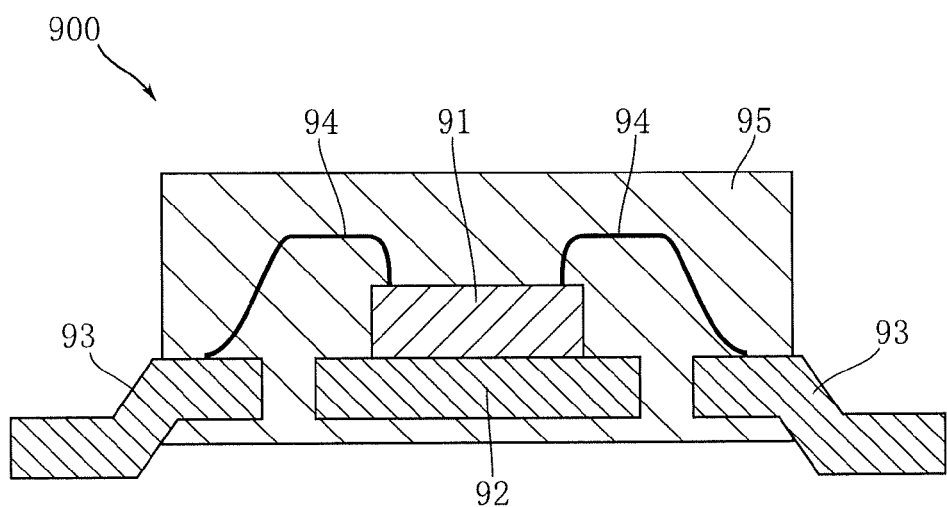
FIG. 13 is a sectional view showing an example of conventional semiconductor device.

Then, as shown in FIG. 12, the capillary 480 is moved up, with the feed of the wire 400 stopped. As a result, the wire 400 is cut adjacent to the front end of the capillary 480. In this way, the formation of the wire 410 is completed, and the wire bonding structure 110 is provided. The wire 410 has a second bonding portion 412 attached to the ball bump 430 by eutectic bonding. By performing the step shown in FIG. 11 with the center of the capillary 480 as viewed in the z direction positioned close to the ridge 333, the area where the second bonding portion 412 overlaps the bonding surface 331 becomes larger than the area where the second bonding portion 412 overlaps the bonding surface 332, as viewed in the z direction. This is because the wire 400 is pressed against the ball bump 430 relatively strongly at the portion that comes into contact with the right-side portion of the capillary 480 in the y direction. After the above-described process steps, the steps for bonding the wire 420, the step of bonding the wires 450, 460 and the step of forming the resin package 500 are performed, whereby the wire bonding structure 120 and the semiconductor device 101 are obtained.

The advantages of the semiconductor device 101 are described below.

According to this embodiment, the ball bump 430 is bonded to both of the bonding surfaces 331 and 332 that form an angle larger than 180°. This arrangement enhances the bonding strength as compared with the case where the ball bump 430 is bonded to a flat surface. Further, since the second bonding portion 412 is bonded to the bonding surfaces 331, 332 via the ball bump 430, non-uniform pressing such that the second bonding portion 412 is pressed too strongly or insufficiently against either one of the bonding surfaces 331 and 332 is prevented. Thus, the bonding strength of the wire 410 to the lead 310 is enhanced. The wire bonding structure 120 also provides the same advantages as those of the wire bonding structure 110.

Since there is a ridge 333 between the bonding surfaces 331 and 332, relatively strong bonding stress is generated between the ball bump 430 and the ridge 333. This is desirable for enhancing the bonding strength between the ball bump 430 and the lead 310.

When the lead 310 has a bent shape including a front end 311, a connecting portion 312 and a base end 313, the dimension of the front end 311 in the y direction can be reduced by not avoiding the formation of the bonding surfaces 331, 332 at the front end 311. This realizes size reduction of the wire bonding structure 110 and hence size reduction of the semiconductor device 101.

By making the longitudinal direction of the elongated bonding surfaces 331, 332 (x direction) and the direction in which the bridge portion 413 of the wire 410 extends (y direction) be perpendicular to each other, the dimension of the wire bonding structure 110 and hence the semiconductor device 101 in the y direction can be reduced.

The second bonding portion 412 may overlap, by a larger amount, the bonding surface 331, which is the one closer to the semiconductor element 210 of the two bonding surfaces 331 and 332. The bonding surface 331 is oriented in the z direction, and hence perpendicular to the capillary 480 being moved down. This enhances bonding strength in forming the second bonding portion 412.

The arrangement that the longitudinal direction of the front end 311 (bonding surfaces 331, 332) of the lead 310 and the longitudinal direction of the front end 351 (bonding surface 355) of the lead 350 correspond to each other contributes to size reduction of the semiconductor device 101. When a plurality of wires 450 are connected to the lead 350 in order to apply a larger main current, the bonding portions (second bonding portions) of the wires 450 to the bonding surface 355 may preferably be aligned in the x direction, which is suitable for size reduction.

The semiconductor device of the present invention is not limited to the foregoing embodiments. The specific structure of each part of the semiconductor device according to the present invention can be varied in design in many ways.

The invention claimed is:

1. A wire bonding structure comprising:
   a first bonding target;
   a second bonding target; and
   a wire including a first end, a second end and a bridge portion connecting the first end and the second end to each other; wherein,
   the first bonding target includes a first bonding surface to which the first end of the wire is bonded,
   the second bonding target includes a second bonding surface and a third bonding surface forming an angle larger than 180° at an outside of the second bonding target, the second end of the wire being electrically connected to the second bonding surface and the third bonding surface,
   the second bonding surface and the third bonding surface include, respectively, a first bonding part and a second bonding part that are in direct contact with and covered by the second end of the wire,
   the bridge portion of the wire includes an elongated section connected to the second end of the wire, and
   the first bonding part of the second bonding surface lies between the second bonding part of the third bonding surface and the first bonding target in a direction along which the elongated section of the bridge portion extends as viewed in a normal direction relative to the second bonding surface.

2. The wire bonding structure according to claim 1, wherein the second end of the wire overlaps both the second bonding surface and the third bonding surface as viewed in the normal direction relative to the second bonding surface.

3. The wire bonding structure according to claim 1, wherein the first bonding target comprises a semiconductor element, and the second boding target comprises a lead.

4. The wire bonding structure according to claim 1, wherein the third bonding surface is non-parallel to the first bonding surface.

5. The wire bonding structure according to claim 1, wherein the second bonding surface is parallel to the first bonding surface.

6. The wire bonding structure according to claim 1, wherein the second bonding surface and the third bonding surface adjoin to each other with a ridge inbetween.

7. The wire bonding structure according to claim 6, wherein the second bonding surface and the third bonding surface have an elongated shape and are arranged next to each other in a width direction thereof.

8. The wire bonding structure according to claim 2, wherein as viewed in the normal direction relative to the second bonding surface, an area where the second end of the wire and the second bonding surface overlap each other is larger than an area where the second end of the wire and the third bonding surface overlap each other.

9. The wire bonding structure according to claim 1, wherein the wire is made of Au.

10. The wire bonding structure according to claim 3, wherein the lead has a bent shape comprising a front end including the second and the third bonding surfaces, a base end, and a connecting portion connecting the front end and the base end to each other.

11. The wire bonding structure according to claim 10, further comprising a die bonding portion on which the semiconductor element is mounted,
   wherein the die bonding portion and the base end of the lead are at a same horizontal position in the normal direction relative to the second bonding surface.

12. The wire bonding structure according to claim 3, further comprising a main-current lead insulated from the lead,
   wherein the semiconductor element is provided with a gate electrode including the first bonding surface, and a source electrode, conduction of the source electrode being controlled by input from the gate electrode, and the source electrode and the main-current lead are connected to each other by at least one main-current wire.

13. The wire bonding structure according to claim 12, wherein the main-current wire comprises a plurality of main-current wires.

14. The wire bonding structure according to claim 12, wherein the main-current wire is made of Cu.

15. The wire bonding structure according to claim 12, wherein the main-current lead includes a main-current bonding surface to which said at least one main-current wire is bonded.

16. The wire bonding structure according to claim 15, wherein the main-current bonding surface has an elongated shape, and
   each of the second and the third bonding surfaces has an elongated shape, longitudinal directions of the second and the third bonding surfaces corresponding to a longitudinal direction of the main-current bonding surface.

17. The wire bonding structure according to claim 16, wherein the main-current bonding surface and the second and the third bonding surfaces are parallel to an edge of the semiconductor element and overlap each other in a direction proceeding away from the edge.

18. The wire bonding structure according to claim 1, further comprising a resin package covering the first bonding target and the wire.

19. The wire bonding structure according to claim 1, wherein the elongated section of the wire has a generally circular cross section, and the second end of the wire has a non-circular cross section.

20. The wire bonding structure according claim 6, wherein the elongated section of the wire and the second bonding surface form an acute angle inbetween as viewed in a direction in which the ridge extends.

* * * * *